United States Patent
Han et al.

(10) Patent No.: US 8,988,407 B2
(45) Date of Patent: Mar. 24, 2015

(54) GATE DRIVING CIRCUIT AND DISPLAY APPARATUS HAVING THE SAME

(71) Applicant: Samsung Display Co., Ltd., Yongin (KR)

(72) Inventors: Sang Youn Han, Seoul (KR); CheolKyu Kim, Seoul (KR); SungHoon Yang, Seoul (KR); Sanghyun Jeon, Suwon-si (KR)

(73) Assignee: Samsung Display Co., Ltd., Yong (KR)

( * ) Notice: Subject to any disclaimer, the term of this patent is extended or adjusted under 35 U.S.C. 154(b) by 143 days.

(21) Appl. No.: 13/708,104

(22) Filed: Dec. 7, 2012

(65) Prior Publication Data

US 2014/0055436 A1   Feb. 27, 2014

(30) Foreign Application Priority Data

Aug. 22, 2012  (KR) .................. 10-2012-0091914

(51) Int. Cl.
| | |
|---|---|
| G06F 3/038 | (2013.01) |
| G09G 5/00 | (2006.01) |
| H03K 17/687 | (2006.01) |
| G09G 3/36 | (2006.01) |
| H01L 29/786 | (2006.01) |
| G11C 19/28 | (2006.01) |

(52) U.S. Cl.
CPC ............ *H03K 17/687* (2013.01); *G09G 3/3677* (2013.01); *H01L 29/78648* (2013.01); *G09G 3/3696* (2013.01); *G11C 19/28* (2013.01); *G09G 2310/0286* (2013.01)
USPC .......................................... 345/211; 345/214

(58) Field of Classification Search
USPC ........................................................ 345/211
See application file for complete search history.

(56) References Cited

U.S. PATENT DOCUMENTS

| | | | |
|---|---|---|---|
| 7,763,889 B2 | 7/2010 | Park | |
| 8,044,896 B2 | 10/2011 | Tsai | |
| 8,111,342 B2 | 2/2012 | Kang et al. | |
| 8,237,878 B2 | 8/2012 | Shim et al. | |
| 2009/0189677 A1* | 7/2009 | Lee et al. ................. | 327/427 |
| 2010/0255644 A1 | 10/2010 | Park | |
| 2011/0102409 A1* | 5/2011 | Hayakawa ................ | 345/212 |
| 2011/0122117 A1* | 5/2011 | Lee et al. ................. | 345/211 |
| 2011/0147755 A1 | 6/2011 | Miyairi et al. | |

FOREIGN PATENT DOCUMENTS

| | | |
|---|---|---|
| JP | 05-053147 | 3/1993 |
| JP | 2005-136028 | 5/2005 |
| JP | 2011-233889 | 11/2011 |
| KR | 10-2002-0002516 | 1/2002 |

OTHER PUBLICATIONS

Extended European Search Report issued in European Application No. 13164593.9 dated Sep. 27, 2013.

\* cited by examiner

*Primary Examiner* — Charles V Hicks
(74) *Attorney, Agent, or Firm* — H.C. Park & Associates, PLC

(57) ABSTRACT

A display apparatus including a gate driving circuit configured to include a plurality of stages connected to each other one after another. An i-th stage of the stages includes an output transistor and a control part. At least one control transistor included in the control part includes a first control electrode to which a switching control signal is applied, and a second control electrode disposed on a layer different from a layer on which the first control electrode is disposed, and to which a reference voltage is applied.

25 Claims, 13 Drawing Sheets

GATE DRIVING CIRCUIT AND DISPLAY APPARATUS HAVING THE SAME

CROSS-REFERENCE TO RELATED APPLICATION

This application claims priority from and the benefit of Korean Patent Application No. 10-2012-0091914, filed on Aug. 22, 2012, which is hereby incorporated by reference for all purposes as if fully set forth herein.

BACKGROUND

1. Field

Exemplary embodiments of the present invention relate to a gate driving circuit and a display apparatus having the same. More particularly, exemplary embodiments of the present invention relate to a gate driving circuit having superior driving characteristics and a display apparatus having improved display quality.

2. Discussion of the Background

A display apparatus may include gate lines, data lines, and pixels connected to the gate lines and the data lines. The display apparatus may also include a gate driving circuit that sequentially applies gate signals to the gate lines and a data driving circuit that applies data signals to the data lines.

The gate driving circuit may include a shift register in which stages are connected to each other one after another. Each stage may include transistors connected to each other to apply a gate voltage to a corresponding stage.

SUMMARY

Exemplary embodiments of the present invention provide a gate driving circuit capable of preventing a delay of a gate signal.

Exemplary embodiments of the present invention also provide a display apparatus capable of preventing a horizontal line from being recognized.

Additional features of the invention will be set forth in the description which follows, and in part will be apparent from the description, or may be learned by practice of the invention.

An exemplary embodiment of the present invention discloses a gate driving circuit including a plurality of stages, each of which outputs a gate signal, connected to each other one after another.

An i-th stage (i is an integer number equal to or greater than 2) among the stages includes an output transistor that includes a control electrode connected to a first node, which has an electric potential increased by a control signal from a previous stage of the i-th stage, and receives a clock signal to output a gate signal of the i-th stage; and a control part that includes at least one control transistor including an output electrode connected to the first node and controls turn on and off of the output transistor. The control transistor includes a first control electrode and a second control electrode, and the first control electrode is disposed on a layer different from a layer on which the second control electrode is disposed. The first control electrode is configured to receive a switching control signal and the second control electrode is configured to receive a reference voltage having a constant voltage level.

An exemplary embodiment of the present invention also discloses a display apparatus including a display panel, a data driving circuit, and a gate driving circuit. The display panel includes a plurality of gate lines, a plurality of data lines insulated from the gate lines while crossing the gate lines, and a plurality of pixels each connected to a corresponding gate line of the gate lines and a corresponding data line of the data lines.

The data driving circuit applies data signals to the data lines and the gate driving circuit includes a plurality of stages connected to each other one after the other to apply gate signals to the gate lines.

An i-th stage (i is an integer number equal to or greater than 2) among the stages includes an output transistor and a control part.

The output transistor receives a clock signal to output an i-th gate signal. The output transistor includes a control electrode connected to a first node, which has an electric potential increased by a control signal from a previous stage of the i-th stage. The previous stage is an (i−1)th stage.

The control part includes at least one control transistor including an output electrode connected to the first node and controls turn on and off of the first and second output transistors.

The control transistor includes a first control electrode and a second control electrode disposed on a layer different from a layer on which the first control electrode is disposed. The first control electrode is configured to receive a switching control signal and the second control electrode is configured to receive a reference voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
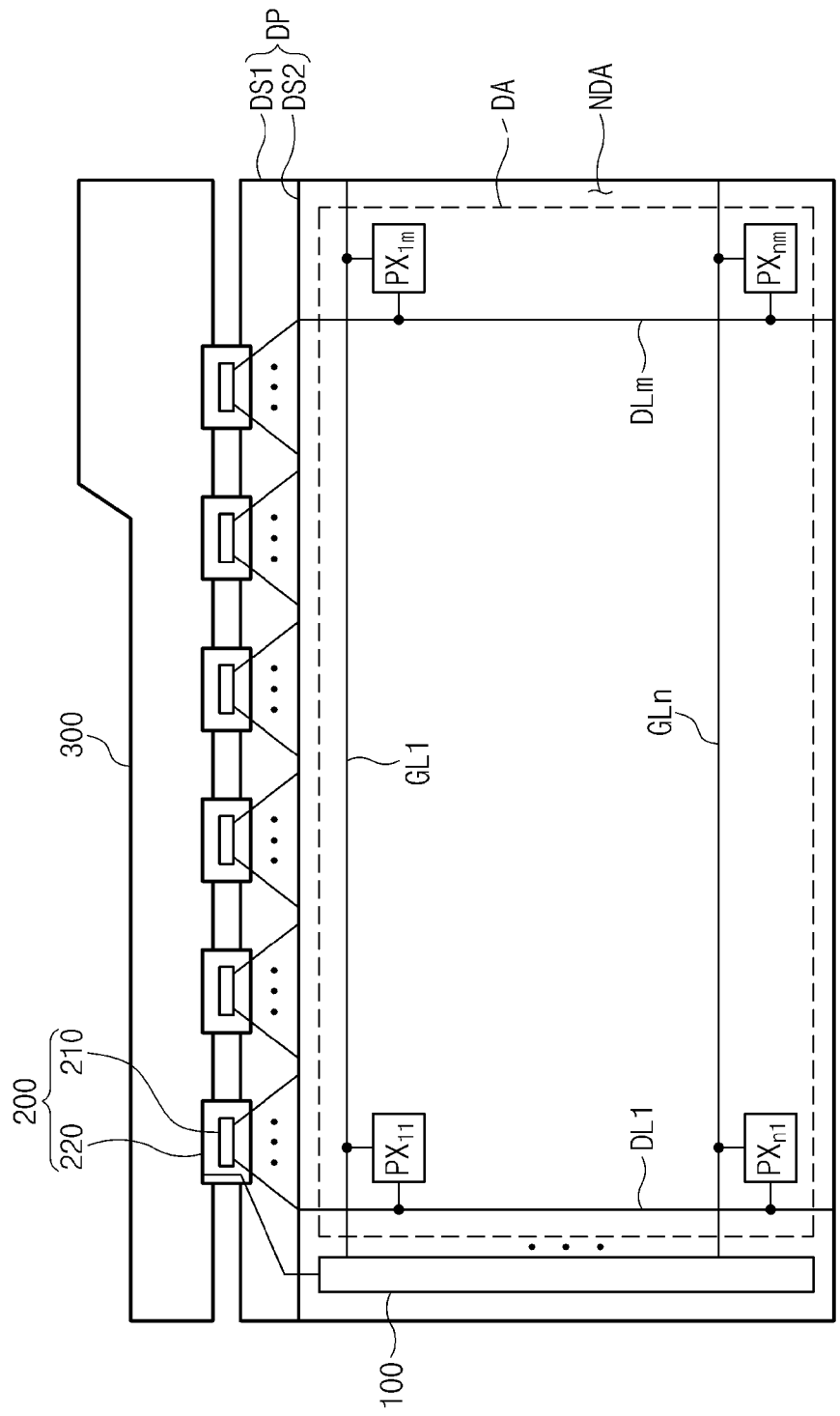
FIG. 1 is a block diagram showing a display apparatus according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on", "connected to," or "coupled to" another element or layer, it can be directly on, connected to or coupled to the other element or layer, or intervening elements or layers may be present. In contrast, when an element is referred to as being "directly on," "directly connected to," or "directly coupled to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ). As used herein, the term "and/or" includes any and all combinations of one or more of the associated listed items.

It will be understood that, although the terms first, second, etc., may be used herein to describe various elements, components, regions, layers and/or sections, these elements, components, regions, layers and/or sections should not be limited by these terms. These terms are only used to distinguish one element, component, region, layer, or section from another region, layer, or section. Thus, a first element, component, region, layer, or section discussed below could be termed a second element, component, region, layer, or section without departing from the teachings of the present invention.

Spatially relative terms, such as "beneath", "below", "lower", "above", "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an," and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a block diagram showing a display apparatus according to an exemplary embodiment of the present invention.

Referring to FIG. 1, a display apparatus includes a display panel DP, a gate driving circuit 100, a data driving circuit 200, and a circuit substrate 300.

Various display panels, such as a liquid crystal display panel, an organic light emitting display panel, an electrophoretic display panel, an electrowetting display panel, etc., may be used as the display panel DP. In the present exemplary embodiment, the liquid crystal display panel will be described as the display panel DP. Meanwhile, in FIG. 1, optical films, e.g., polarizing films, have been omitted.

The display panel DP includes a first substrate DS1, a second substrate DS2 spaced apart from the first substrate DS1, and a liquid crystal layer (not shown) interposed between the first substrate DS1 and the second substrate DS2. The display panel DP is divided into a display area in which a plurality of pixels PX11 to PXnm is arranged, and a non-display area NDA surrounding the display area DA.

The first substrate DS1 includes a plurality of gate lines GL1 to GLn and a plurality of data lines DL1 to DLm crossing the gate lines GL1 to GLn, which are disposed thereon. FIG. 1 shows a portion of the gate lines GL1 to GLn and a portion of the data lines DL1 to DLm.

The gate lines GL1 to GLn are connected to the gate driving circuit 100 to receive gate signals according to various driving schemes. The data lines DL1 to DLm are connected to the data driving circuit 200 to receive data signals (or data voltages) in analog form.

Each of the pixels PX11 to PXnm is connected to a corresponding gate line of the gate lines GL1 to GLn and a corresponding data line of the data lines DL1 to DLm.

The gate driving circuit 100 may be substantially simultaneously formed with the pixels PX11 to PXnm through a thin film process. For example, the gate driving circuit 100 may be mounted on the non-display area NDA with amorphous silicon TFT gate driver circuit (ASG).

Referring to FIG. 1, the gate driving circuit 100 is disposed adjacent to left ends of the gate lines GL1 and GLn, but the location should not be limited thereto or thereby. Although not shown in FIG. 1, the display apparatus may include two gate driving circuits 100. In this case, one of the two gate driving circuits 100 is connected to the left ends of the gate lines GL1 to GLn and the other one of the two gate driving circuits 100 (not shown) is connected to right ends of the gate lines GL1 to GLn. In addition, one of the two gate driving circuits 100 may be connected to odd-numbered gate lines of the gate lines GL1 to GLn and the other one of the two gate driving circuits 100 may be connected to even-numbered gate lines of the gate lines GL1 to GLn. Further, the gate driving circuit 100 need not be integrally formed on the display panel DP. For example, it can be formed as an integrated circuit that is connected to the display panel The data driving circuit 200 receives data signals from a timing controller (not shown) mounted on the circuit substrate 300 and generates analog data signals corresponding to the data signals.

The data driving circuit 200 includes a driving chip 210 and a flexible printed circuit board 220 on which the driving chip 210 is mounted. A plurality of driving chips 210 and flexible printed circuit boards 220 may be provided. The flexible printed circuit boards 220 are electrically connected between the circuit substrate 300 and the first substrate DS1. Each of the driving chips 210 applies the data signals to corresponding data lines of the data lines DL1 to DLm.

FIG. 1 shows the data driving circuit 200 configured by a tape carrier package, but it should not be limited to the tape carrier package. That is, the data driving circuit 200 may be mounted on the first substrate DS1 by a chip-on-glass method.

Figure 2:
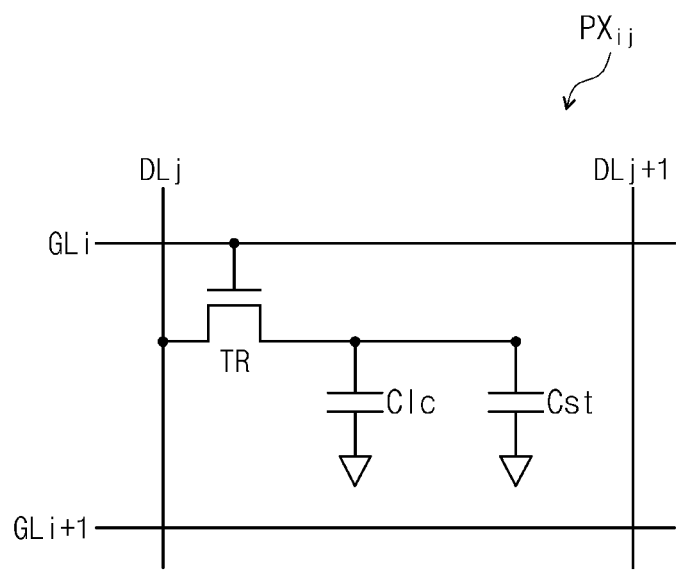
FIG. 2 is an equivalent circuit diagram of a pixel according to an exemplary embodiment of the present invention.

FIG. 2 is an equivalent circuit diagram showing a pixel PXij according to an exemplary embodiment of the present invention. Each of the pixels PX11 to PXnm shown in FIG. 1 has the equivalent circuit diagram as shown in FIG. 2.

Referring to FIG. 2, the pixel PXij includes a thin film transistor TR, a liquid crystal capacitor Clc, and a storage capacitor Cst. The thin film transistor TR is electrically connected to an i-th gate line GLi and a j-th data line DLj. The thin film transistor TR outputs the data signal provided from the j-th data line DLj in response to the gate signal provided from the i-th gate line GLi.

The liquid crystal capacitor Clc is charged with a voltage corresponding to the data signal output from the j-th data line DLj. Liquid crystal directors of the liquid crystal layer (not shown) are changed in accordance with an amount of electric charges charged in the liquid crystal capacitor Clc. The liquid crystal layer blocks or transmits light incident thereto according to an arrangement of the liquid crystal directors.

The storage capacitor Cst is connected to the liquid crystal capacitor Clc in parallel. The storage capacitor Cst maintains the arrangement of the liquid crystal directors for a predetermined period.

Figure 3:
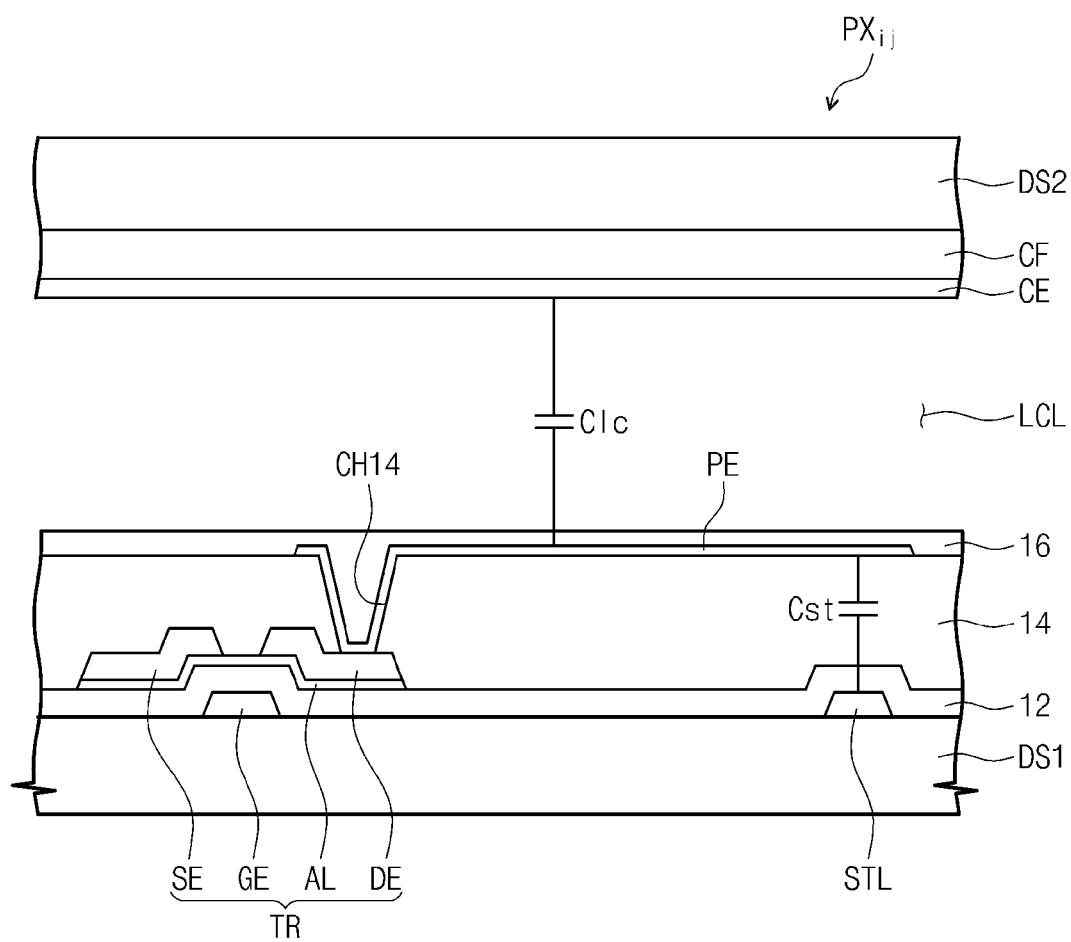
FIG. 3 is a cross-sectional view of a pixel according to an exemplary embodiment of the present invention.

FIG. 3 is a cross-sectional view of the pixel PXij according to an exemplary embodiment of the present invention.

Referring to FIG. 3, the thin film transistor TR includes a gate electrode GE connected to the i-th gate line GLi, an active layer AL overlapped with the gate electrode GE, a source electrode SE connected to the j-th data line DLj, and a drain electrode DE spaced apart from the source electrode SE.

The i-th gate line GL and a storage line STL are disposed on a surface of the first substrate DS1. The gate electrode GE is branched from the i-th gate line GLi. A first gate insulating layer 12 is disposed on the first substrate DS1 to cover the gate electrode GE and the storage line STL.

The active layer AL is disposed on the first insulating layer 12 to overlap with the gate electrode GE. The active layer AL includes a semiconductor layer and an ohmic contact layer (not shown). The drain electrode DE and the source electrode SE are disposed on the active layer AL. Each of the drain electrode DE and the source electrode SE is partially overlapped with the active layer AL.

A second insulating layer 14 is disposed on the first insulating layer 12 to cover the active layer AL, the drain electrode DE, and the source electrode SE. A pixel electrode PE is disposed on the second insulating layer 14. The pixel electrode PE is electrically connected to the drain electrode DE through a contact hole CH14 formed through the second insulating layer 14. A third insulating layer 16 is disposed on the second insulating layer 14 to cover the pixel electrode PE.

A color filter layer CF is disposed on the second substrate DS2. A common electrode CE is disposed on the color filter CF. A common voltage is applied to the common electrode CE.

The pixel electrode PE and the common electrode CE, which face each other while interposing the liquid crystal layer LCL therebetween, form the liquid crystal capacitor Clc. The pixel electrode PE receives a pixel voltage corresponding to the data signal. The pixel voltage has a level different from that of the common voltage. The liquid crystal capacitor Clc is charged with the electric charges in accordance with the pixel voltage and the common voltage.

In addition, the pixel electrode PE and the storage line STL, which face each other while interposing the first and second insulating layers 12 and 14 therebetween, form the storage capacitor Cst. The storage line STL receives a storage voltage different from the pixel voltage. The storage capacitor Cst is charged with the electric charges in accordance with the pixel voltage and the storage voltage.

Meanwhile, instead of the structure of the pixel PXij shown in FIG. 3, the color filter layer CF or the common electrode CE may be disposed on the first substrate DS1.

Figure 4:
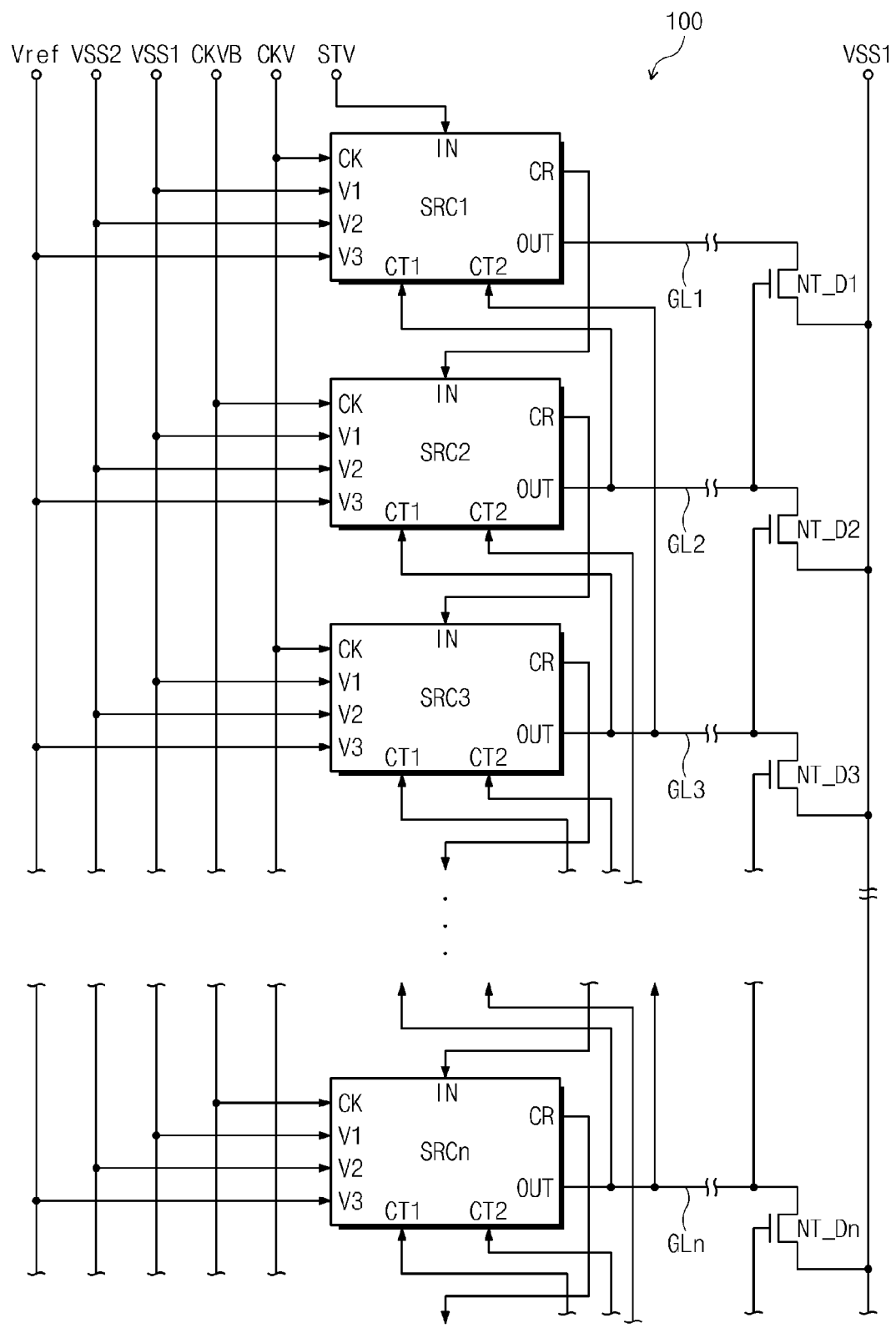
FIG. 4 is a block diagram of a gate driving circuit according to an exemplary embodiment of the present invention.

FIG. 4 is a block diagram showing the gate driving circuit according to an exemplary embodiment of the present invention.

Referring to FIG. 4, the gate driving circuit 100 includes a plurality of stages SRC1 to SRCn connected to each other one after another. The stages SRC1 to SRCn form one shift register.

The stages SRC1 to SRCn are connected to the gate lines GL1 to GLn, respectively. That is, the stages SRC1 to SRCn respectively apply the gate signals to the gate lines GL1 to GLn.

Each of the stages SRC1 to SRCn includes an input terminal IN, a clock terminal CK, first, second, and third voltage input terminals V1, V2, and V3, first and second controls terminals CT1 and CT2, an output terminal OUT, and a carry terminal CR.

The carry terminal CR of each of the stages SRC1 to SRCn is electrically connected to the input terminal IN of a next stage. The input terminal IN of each of the stages SRC1 to SRCn receives a carry signal from a previous stage. The input terminal IN of an i-th stage (not shown) is electrically connected to the carry terminal CR of an (i−1)th stage. The "i" is an integer number greater than one (1) and smaller than the "n". As shown in FIG. 4, the input terminals IN of the second and third stages SRC2 and SRC3 receive the carry signals CR from the first stage SRC1 and the second stage SRC2, respectively. Among the stages SRC1 to SRCn, the input terminal IN of the first stage SRC1 receives a start signal STV that starts operation of the gate driving circuit 100 instead of the carry signal of the previous signal.

The configuration of the stages SRC1 to SRCn should not be limited to the above-mentioned configuration. That is, the input terminal IN of the i-th stage may be electrically connected to the carry terminal of the (i−1)th stage, the (i−2)th stage, or the (i−3)th stage. For instance, the second stage SRC2 may receive the start signal different from the start signal applied to the first stage SRC1, and the input terminal IN of the third stage SRC3 may receive the carry signal of the first stage SRC1.

The first control terminal CT1 of each of the stages SRC1 to SRCn is electrically connected to the output terminal OUT of the next stage to receive the gate signal of the next stage. The second control terminal CT2 of each of the stages SRC1 to SRCn is electrically connected to the output terminal OUT of the stage subordinately connected to the next stage to receive the gate signal of the stage subordinately connected to the next stage.

The first control terminal CT1 of the i-th stage is electrically connected to the output terminal OUT of the (i+1)th stage, and the second control terminal CT2 of the i-th stage is electrically connected to the output terminal OUT of the (i+2)th stage. As shown in FIG. 4, the first control terminal CT1 of the first stage SRC1 is electrically connected to the output terminal OUT of the second stage SRC2, and the second control terminal CT2 of the first stage SRC1 is electrically connected to the output terminal OUT of the third stage SRC3.

The first and second control terminals CT1 and CT2 of a last stage SRCn of the stages SRC1 to SRCn receive signals corresponding to the gate signals from dummy stages (not shown). The dummy stages are not connected to the gate lines GL1 to GLn.

The configuration of the stages SRC1 to SRCn is not limited to the above-mentioned configuration. That is, the first control terminal CT1 of the i-th stage may be electrically connected to the output terminal OUT of any one stage of the stages following the i-th stage. In addition, the second control terminal CT2 of the i-th stage may be electrically connected to the output terminal OUT of any one stage of the stages following the stage that applies the gate signal to the first control terminal CT1 of the i-th stage.

Further, the connection relation of the gate driving circuit 100 is not limited to the connection relation shown in FIG. 4.

Instead of the arrangement shown in FIG. 4, the input terminals IN of the stages SRC1 to SRCn may instead receive the gate signals from the output terminals OUT of the previous stages, respectively. That is, the carry signal or the gate signal applied to the input terminals IN of the stages SRC1 to SRCn serves as a control signal to control the operation of the stages SRC1 to SRCn.

In addition, the first control terminal CT1 of each of the stages SRC1 to SRCn may be electrically connected to the carry terminal CR of the next stage to receive the carry signal from the next stage instead of the output terminal OUT of the next stage. The second control terminal CT2 of each of the stages SRC1 to SRCn may be electrically connected to the carry terminal CR of the stage subordinately connected to the next stage. The second control terminal CT2 of each of the stages SRC1 to SRCn receives the carry signal from the stage subordinately connected to the next stage.

Among the stages SRC1 to SRCn, odd-numbered stages SRC1 and SRC3 receive signals having a phase opposite to that of the signals applied to even-numbered stages SRC2 and SRCn. The clock terminal CK of the odd-numbered stages SRC1 and SRC3 receive a clock signal CKV and the clock terminal CK of the even-numbered stages SRC2 and SRCn receive a clock bar signal CKVB.

A first voltage VSS1 (or a first low voltage) is applied to the first voltage input terminal V1 of each of the stages SRC1 to SRCn, and a second voltage VSS2 (or a second low voltage) lower than the first voltage VSS1 is applied to the second voltage input terminal V2 of each of the stages SRC1 to SRCn. The first voltage VSS1 may be a ground voltage or a negative (−) voltage. As an example, the first voltage VSS1 may be about −6 volts and the second voltage VSS2 may be about −10 volts.

A third voltage Vref is applied to the third voltage input terminal V3 of each of the stages SRC1 to SRCn. The third voltage Vref serves as a reference voltage (or a bias voltage) having a constant positive (+) level. For example, the third voltage Vref may have a voltage level in a range from about zero (0) volt to about 15 volts, or a range from about 5 volts to about 7 volts.

According to another exemplary embodiment, the third voltage Vref may have the same level as the common voltage applied to the common electrode CE. That is, the third voltage Vref may be the same voltage as the common voltage. According to another exemplary embodiment, the third voltage Vref may have the same level as the storage voltage applied to the storage line STL. In other words, the third voltage Vref may be the same voltage as the storage voltage.

The output terminal OUT of each of the stages SRC1 to SRCn is connected to the corresponding gate line of the gate lines GL1 to GLn. Accordingly, the gate signal output from the output terminal OUT is applied to the corresponding gate line.

A plurality of discharge transistors NT_D1 to NT_Dn are connected to the right ends of the gate lines GL1 to GLn, respectively. Each of the discharge transistors NT_D1 to NT_Dn includes a control electrode connected to the next gate line of the corresponding gate line, an input electrode applied with the first voltage VSS1, and an output electrode connected to the corresponding gate line. Thus, each of the discharge transistors NT_D1 to NT_Dn discharges the gate signal of the corresponding gate line to the first voltage VSS1 in response to the next gate signal applied to the next gate line.

Figure 5:
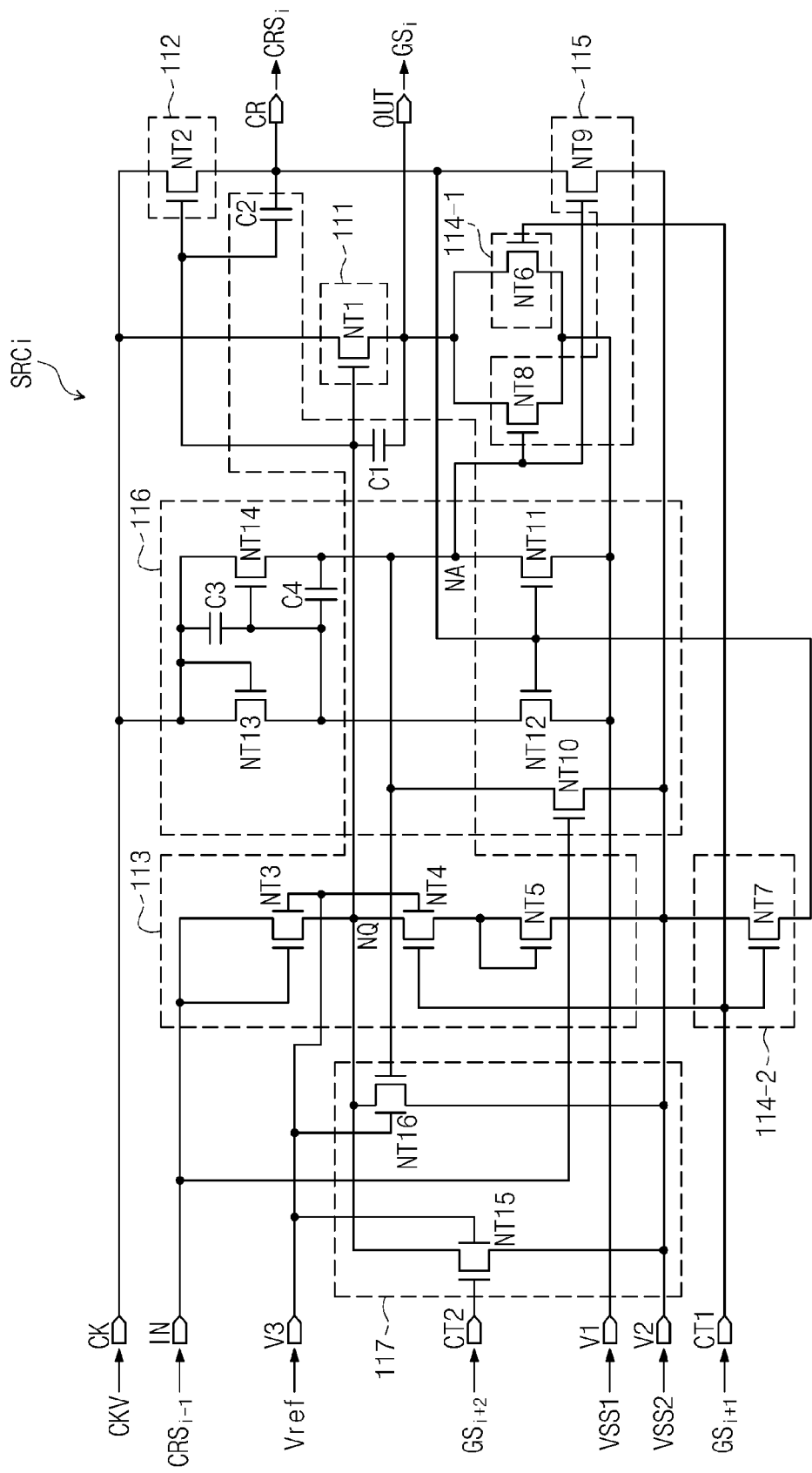
FIG. 5 is a circuit diagram of an i-th stage of stages shown in FIG. 4.
Figure 6:
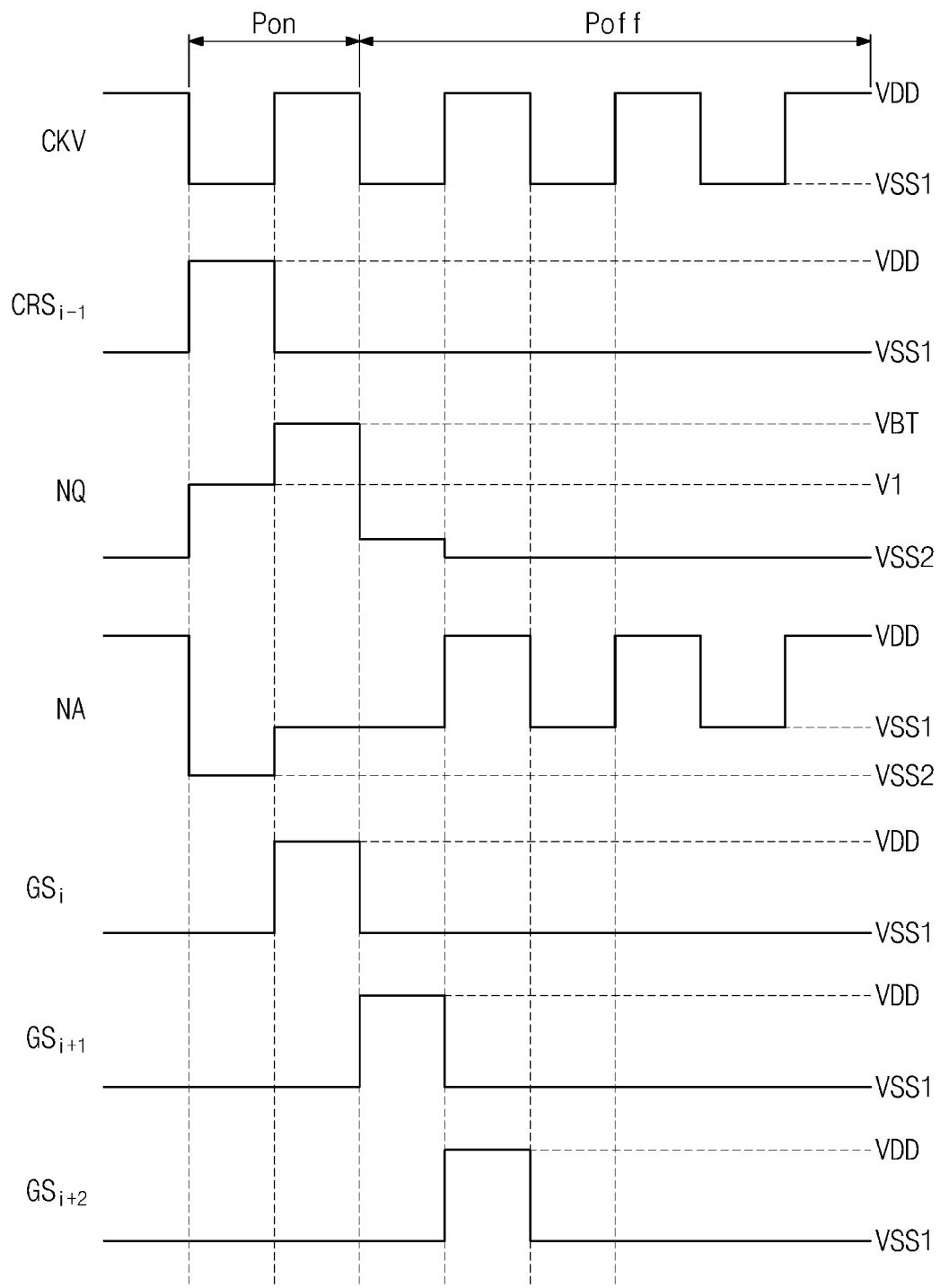
FIG. 6 is a waveform diagram of input and output signals of the i-th stage shown in FIG. 5.

FIG. 5 is a circuit diagram showing the i-th stage shown in FIG. 4 and FIG. 6 is a waveform diagram of input and output signals of the i-th stage shown in FIG. 5. Each of the stages SRC1 to SRCn shown in FIG. 4 may have the same circuit configuration as shown in FIG. 5.

Referring to FIG. 5, the i-th stage SRCi includes a first output part 111, a second output part 112, and a control part 113. In addition, the i-th stage SRCi includes a first pull-down part 114-1, a second pull-down part 114-2, a hold part 115, a switch part 116, and a stabilization part 117.

The first output part 111 applies the gate signal GSi to the i-th gate line (not shown) and the second output part 112 applies the carry signal CRSi to the (i+1)th stage.

The control part 113 controls the operation of the first output part 111 and the second output part 112. The control part 113 turns on the first output part 111 and the second output part 112 in response to the carry signal CRSi−1 from the (i−1)th stage, and turns off the first output part 111 and the second output part 112 in response to the gate signal GSi+1 from the (i+1)th stage.

The first pull-down part 114-1 pull downs an electric potential of the output terminal OUT to the first voltage VSS1, and the second pull-down part 114-2 pulls down an electric potential of the carry terminal CR to the second voltage VSS2.

The hold part 115 holds the gate signal GSi at the first voltage VSS1 during a turn-off period Poff of the first output part 111 and holds the carry signal CRSi at the second voltage VSS2 during the turn-off period Poff of the first output part 111.

The switch part 116 controls the operation of the hold part 115. That is, the switch part 116 turns on or off the hold part 115. The switch part 116 applies a switching control signal to a second node NA to turn on or off the hold part 115. Here, the second node NA indicates an output terminal of the switch part 116 that is connected to control terminals of the hold part 115.

Hereinafter, the configuration of the i-th stage SRCi will be described in detail with reference to FIGS. 5 and 6.

The first output part 111 includes a first output transistor NT1. The first output transistor NT1 includes an input electrode, a control electrode connected to a control electrode of the control part 113, and an output electrode that outputs the gate signal GSi, where the clock signal CKV is applied to the input electrode. The control electrode of the first output transistor NT1 is connected to a first node NQ that serves as the output terminal of the control part 113.

The second output part 112 includes a second output transistor NT2. The second output transistor NT2 includes an input electrode, a control electrode connected to the control electrode of the first output transistor NT1, and an output electrode that outputs the carry signal CRSi, where the clock signal CKV is applied to the input electrode.

The control part 113 includes first, second, and third control transistors NT3, NT4, and NT5, a first capacitor C1, and a second capacitor C2. Each of the first and second control transistors NT3 and NT4 includes a first control electrode and second control electrode, and the first control electrode is disposed on a layer different from a layer on which the second control electrode is disposed.

The first control transistor NT3 includes the first control electrode and an input electrode, which commonly receive the carry signal CRSi−1 of the (i−1)th stage. The carry signal CRSi−1 of the (i−1)th stage is used as a switching control signal of the first control transistor NT3. In addition, the first control transistor NT3 includes an output electrode connected to the control electrodes of the first output transistor NT1 and the second output transistor NT2 through the first node NQ.

The second control transistor NT4 includes an output electrode connected to the first node NQ, the first control electrode, and an input electrode, where the gate signal GSi+1 of the (i+1)th stage is applied to the first control electrode.

The third control transistor NT5 includes a control electrode and an output electrode, which are commonly connected to the input electrode of the second control transistor NT4, so as to serve as a diode. In addition, the third control transistor NT5 includes an input electrode connected to the second voltage input terminal V2, which is configured to receive the second voltage VSS2. The third control transistor NT5 may be omitted. When the third control transistor NT5 is omitted, the input electrode of the second control transistor NT4 is connected to the second voltage input terminal V2 to directly receive the second voltage VSS2.

The first capacitor C1 is connected between the control electrode and the output electrode of the first output transistor NT1, and the second capacitor C2 is connected between the control electrode and the output electrode of the second output transistor NT2.

When the first control transistor NT3 is turned on in response to the carry signal CRSi−1 of the (i−1)th stage, an electric potential of the first node NQ increases to a first high voltage VQ1, and the first and second output transistors NT1 and NT2 are turned on.

When the carry signal CRSi−1 of the (i−1)th stage is applied to the first node NQ through the turn-on of transistor NT3, the first capacitor C1 is charged. Then, the first output transistor NT1 is boot strapped. That is, the first node NQ connected to the control electrode of the first output transistor NT1 is boosted from the first high voltage VQ1 to a second high voltage VQ2.

When the second and third control transistors NT4 and NT5 are turned on in response to the gate signal GSi+1 of the (i+1)th stage, the electric potential of the first node NQ decreases. In this case, the electric potential of the first node NQ is slightly higher than the second voltage VSS2 as a result of the third control transistor NT5. When the electric potential of the first node NQ is decreased, the first and second output transistors NT1 and NT2 connected to the first node NQ are turned off.

The first pull-down part 114-1 includes a first pull-down transistor NT6 and the second pull-down part 114-2 includes a second pull-down transistor NT7.

The first pull-down transistor NT6 includes an output electrode connected to the output electrode of the first output transistor NT1, a control electrode which is configured to receive the gate signal GSi+1 of the (i+1)th stage, and an input electrode connected to the first voltage input terminal V1.

The first pull-down transistor NT6 pulls down the electric potential of the output terminal OUT to the first voltage VSS1 in response to the gate signal GSi+1 of the (i+1) the stage.

The second pull-down transistor NT7 includes a control electrode which is configured to receive the gate signal GSi+1 of the (i+1)th stage, an input electrode connected to the second voltage input terminal V2, and an output electrode. The output electrode of the second pull-down transistor NT7 is connected to control electrodes of second and third switching transistors that will be described later. In addition, the output electrode of the second pull-down transistor NT7 is electrically connected to the output electrode of the second output transistor NT2. The second pull-down transistor NT7 may be omitted.

The second pull-down transistor NT7 pulls down the electric potential of the carry terminal CR to the second voltage VSS2 in response to the gate signal GSi+1 of the (i+1)th stage.

The hold part 115 includes a first hold transistor NT8 and a second hold transistor NT9. The first hold transistor NT8 holds the electric potential of the output terminal OUT at the first voltage VSS1 during the turn-off period of the first output transistor NT1 and the second hold transistor NT9 holds the electric potential of the carry terminal CR at the second voltage VSS2 during the turn-off period of the second output transistor NT2.

In detail, the first hold transistor NT8 includes an output electrode connected to the output electrode of the first output transistor NT1, a control electrode connected to the second node NA, and an input electrode connected to the first voltage input terminal V1. The second hold transistor NT9 includes an output electrode connected to the output electrode of the second output transistor NT2, a control electrode connected to the second node NA, and the input electrode connected to the second voltage input terminal V2.

The switch part 116 includes first, second, third, fourth, and fifth switch transistors NT10, NT11, NT12, NT13, and NT14 and third and fourth capacitors C3 and C4.

The switch part 116 applies the second voltage VSS2 to the second node NA in response to the carry signal CRSi−1 of the (i−1)th stage (not shown) during the turn-on period Pon of the first output part 111. The hold part 115 is turned off in response to the second voltage VSS2. Then, the switch part 116 applies the first voltage VSS1 to the second node NA in response to the clock signal CKV. The hold part 115 is maintained in the turned-off stage in response to the first voltage VSS1.

The switch part 116 applies a voltage corresponding to the clock signal CKV to the second node NA during the turn-off period Poff of the first output part 111. That is, during the turn-off period Poff of the first output part 111, the first voltage VSS1 and the third high voltage VDD are alternately applied to the second node NA. When the third high voltage VDD is applied to the second node NA during the turn-off period Poff of the first output part 111, the hold part 115 is turned on.

The first switch transistor NT10 includes an output electrode connected to the second node NA, a control electrode which is configured to receive the carry signal CRSi−1 of the (i−1)th stage, and an input electrode connected to the second voltage input terminal V2.

The second switch transistor NT11 includes an output electrode connected to the control electrode of the first hold transistor NT8, a control electrode which is configured to receive the carry signal CRSi from the second output part 112, and an input electrode connected to the first voltage input terminal V1. In addition, the control electrode of the second switch transistor NT11 is electrically connected to the output electrode of the second pull-down transistor NT7.

The third switch transistor NT12 includes a control electrode connected to the output electrode of the second pull-down transistor NT7, an input electrode connected to the first voltage input terminal V1, and an output electrode.

The fourth switch transistor NT13 includes an input electrode and a control electrode, both of which receive the clock signal CKV. The fourth switch transistor NT13 includes an output electrode connected to the output electrode of the third switch transistor NT12.

The fifth switch transistor NT14 includes an input electrode which is configured to receive the clock signal CKV, a control electrode connected to the output electrode of the fourth switch transistor NT13, and an output electrode connected to the second node NA.

The third capacitor C3 is connected between the input electrode of the fifth switch transistor NT14 and the control electrode of the fifth switch transistor NT14, and the fourth capacitor C4 is connected between the output electrode of the fourth switch transistor NT13 and the output electrode of the fifth switch transistor NT14.

Hereinafter, the operation of the switch part 116 will be described in detail.

The first switch transistor NT10 applies the second voltage VSS2 to the second node NA in response to the carry signal CRSi–1 of the (i–1)th stage.

The second switch transistor NT11 applies the first voltage VSS1 to the second node NA during the turn-on period of the second output part 112. Accordingly, the first and second hold transistors NT8 and NT9 are turned off by the first voltage VSS1 during the turn-on period of the second output part 112.

The third switch transistor NT12 is turned on during the turn-on period of the second output part 112 to lower the clock signal CKV output from the fourth switch transistor NT13 to the first voltage VSS1. As a result, the clock signal CKV may be prevented from being applied to the second node NA. Here, the turn-on period of the second output part 112 corresponds to the high period of the clock signal CKV.

The third and fourth capacitors C3 and C4 are charged with the voltage according to the clock signal CKV. Then, the fifth switch transistor NT14 is turned on by the charged voltage in the third and fourth capacitors C3 and C4. In addition, when the first, second, and third switch transistors NT10, NT11, and NT12 are turned off, the electric potential of the second node NA increases by the charged voltage in the third and fourth capacitors C3 and C4.

When the electric potential of the second node NA increases, the first and second hold transistors NT8 and NT9 are turned on, and thus the output terminal OUT and the carry terminal CR are held at the first voltage VSS1 and the second voltage VSS2, respectively, by the turned-on first and second holding transistors NT8 and NT9.

The stabilization part 117 includes a first stabilization transistor NT15 and a second stabilization transistor NT16. Each of the first stabilization transistor NT15 and the second stabilization transistor NT16 includes a first control electrode and second control electrode, and the first control electrode is disposed on a layer different from a layer on which the second control electrode is disposed.

The first stabilization transistor NT15 includes an input electrode connected to the second voltage input terminal V2, the first control electrode applied with the gate signal GSi+2 of the (i+2)th stage, and an output electrode connected to the first node NQ.

The second stabilization transistor NT16 includes an input electrode connected to the second voltage input terminal V2, the first control electrode connected to the second node NA, and an output electrode connected to the first node NQ.

The first stabilization transistor NT15 applies the second voltage VSS2 to the first node NQ in response to the gate signal GSi+2 of the (i+2)th stage. Accordingly, the electric potential of the first node NQ is stabilized to the second voltage VSS2 by the gate signal GSi+2 of the (i+2)th stage.

In addition, the second stabilization transistor NT16 is turned on or off in accordance with the electric potential of the second node NA. When the electric potential of the second node NA is decreased to the first voltage VSS1, the second stabilization transistor NT16 is turned off. When the electric potential of the second node NA is increased by the clock signal CKV, the second stabilization transistor NT16 is turned on.

The turned-on second stabilization transistor NT16 reduces the electric potential of the first node NQ to the second voltage VSS2. Accordingly, the electric potential of the first node NQ is stabilized to the second voltage VSS2 by the first and second stabilization transistors NT15 and NT16 during the lower period of the gate signal GSi.

Figure 7:
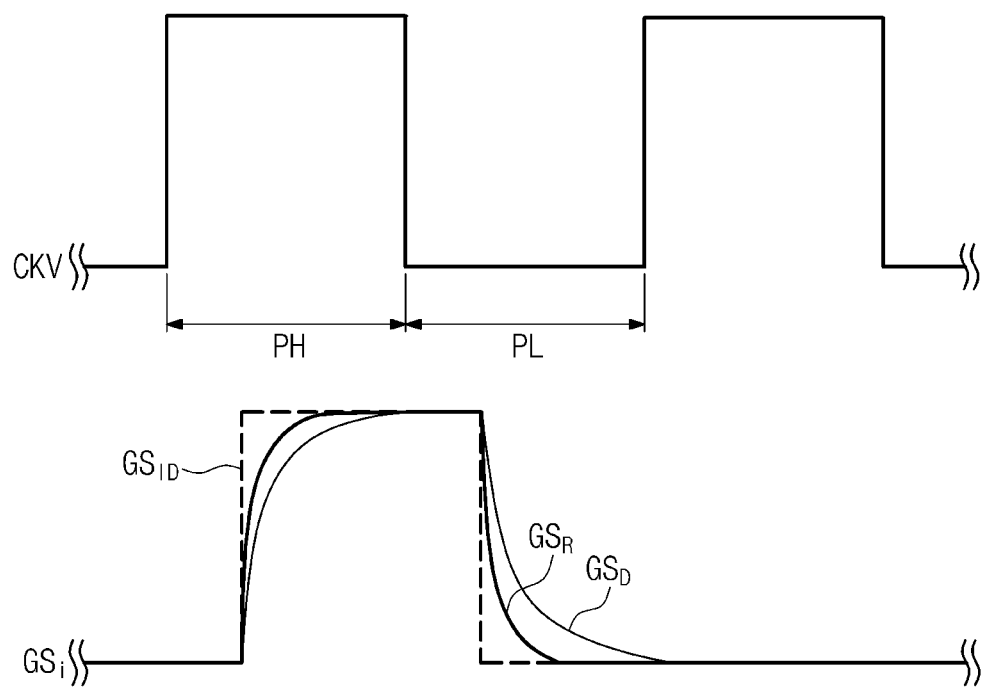
FIG. 7 is a view showing a clock signal applied to the i-th stage and a gate signal output from the i-th stage.

FIG. 7 is a view showing the clock signal applied to the i-th stage and the gate signal output from the i-th stage.

The clock signal CKV includes a high period PH and a low period PL, which are repeated. The clock signal CKV applied to the clock terminal CK is output through the first output transistor NT1. The clock signal CKV output from the output terminal OUT is the gate signal GSi.

A first signal $GS_{ID}$, a second signal $GS_R$, and a third signal $GS_D$ shown in FIG. 7 indicate an ideal gate signal, a normal gate signal, and a delayed gate signal, respectively. The first signal $GS_{ID}$ is the same as the high period PH of the clock signal CKV that is delayed. The second signal $GS_R$ is delayed slightly more than the first signal $GS_{ID}$ due to RC-delay of the signal line of the i-th stage. The third signal $GS_D$ is delayed more than the second signal $GS_R$. This is because the first output transistor NT1 is turned on late.

When the gate signal as the third signal $GS_D$ is applied to the i-th gate line from the i-th stage, the charge rate of the pixels connected to the i-th gate line is less than the charge rate of the pixels connected to other gate lines. This is because the transistors of the pixels connected to the i-th gate line are turned on late as a result of the third signal $GS_D$. As a result, a horizontal line appears on the display apparatus along the pixel row in which the pixels having the low charge rate are arranged.

In addition, the reason why the first output transistor NT1 is turned on late is because the electric potential of the control terminal of the first output transistor NT1 is slowly increased.

Referring to FIG. 5 again, the electric potential of the control terminal of the first output transistor NT1 is equal to the electric potential of the first node NQ. As described above, the electric potential of the first node NQ increases by the carry signal CRSi–1 of the (i–1)th stage.

When a current leakage occurs in the transistors NT3, NT4, NT15, and NT16 connected to the first node NQ, the time period, i.e., the increase time, required to charge the first node NQ is increased. The current leakage serves as a kink current flowing from the output electrode (or drain electrode) connected to the first node NQ to the input electrode (or source electrode) of each of the transistors NT3, NT4, NT15, and NT16. In other words, as a result of the kink current of the transistors NT3, NT4, NT15, and NT16 connected to the first node NQ, the increase time of the electric potential of the first node NQ is delayed.

The kink current occurring in the transistors NT3, NT4, NT15, and NT16 connected to the first node NQ is caused by a band-to-band tunneling phenomenon.

Figure 8A:
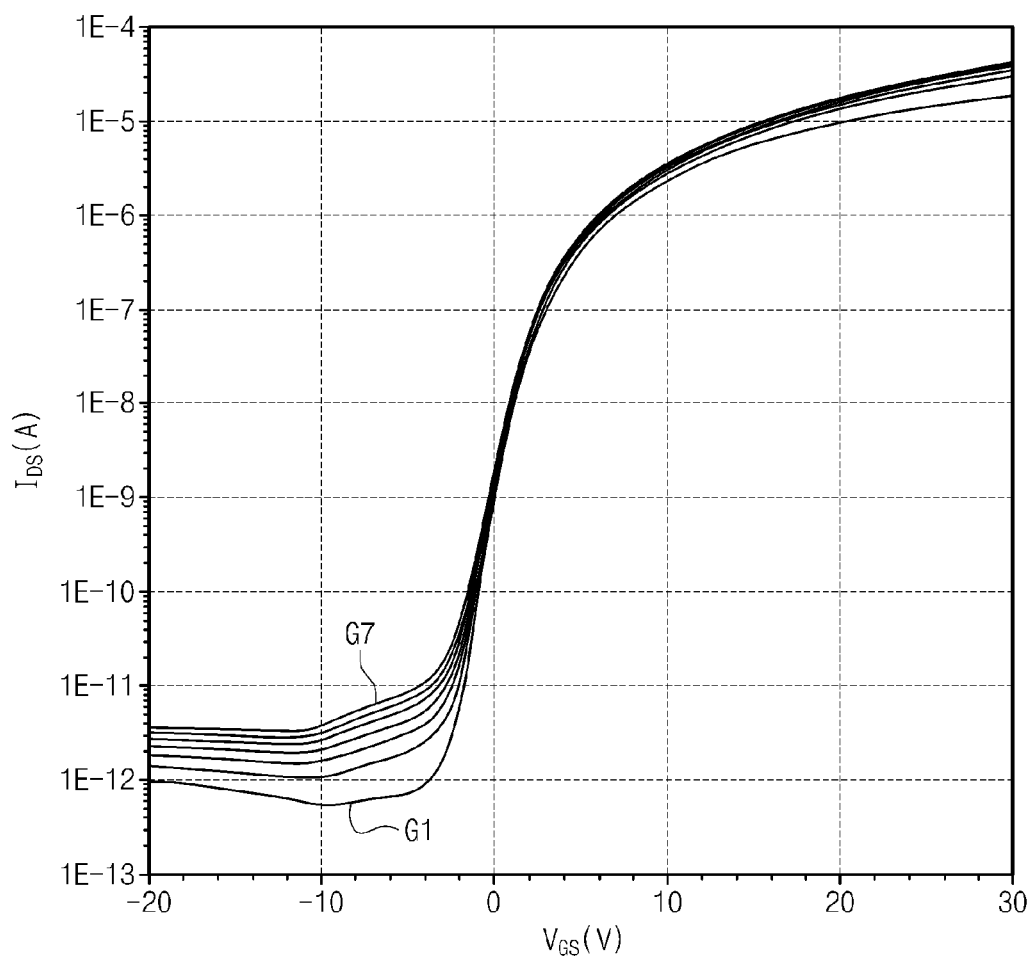
FIG. 8A and FIG. 8B are graphs showing a relationship between a kink current and a gate-source voltage of a thin film transistor to explain a band-to-band tunneling phenomenon.
Figure 8B:
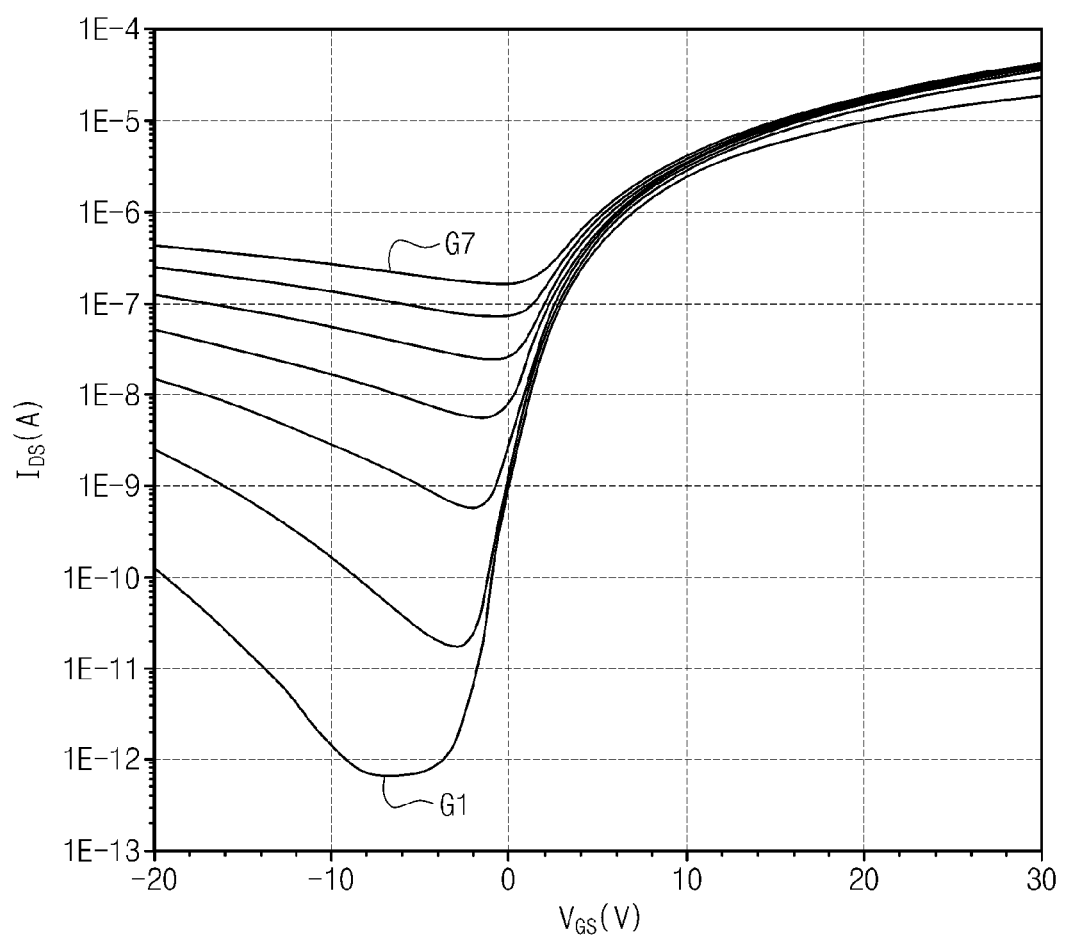

FIGS. 8A and 8B are graphs showing a relationship between the kink current Ids and the gate-source voltage Vgs of the thin film transistor to explain the band-to-band tunneling phenomenon. FIG. 8A is a simulation graph of the kink current Ids of the thin film transistor in which no band-to-band tunneling phenomenon occurs, and FIG. 8B is a simulation graph of the kink current Ids of the thin film transistor in which the band-to-band tunneling phenomenon occurs. Each of first to seventh curves G1 to G7 shown in FIGS. 8A and 8B has a drain-source voltage Vds of about 10 volts to about 70 volts.

As shown in FIG. 8A, the kink current Ids of the thin film transistor in which no band-to-band tunneling occurs is relatively low, regardless of the drain-source voltage Vds when the gate-source voltage Vgs is less than zero (0) volts. As shown in FIG. 8B, the kink current Ids of the thin film transistor in which the band-to-band tunneling occurs is increased as the drain-source voltage Vds increases when the gate-source voltage Vgs is less than zero (0) volts.

Figure 9A:
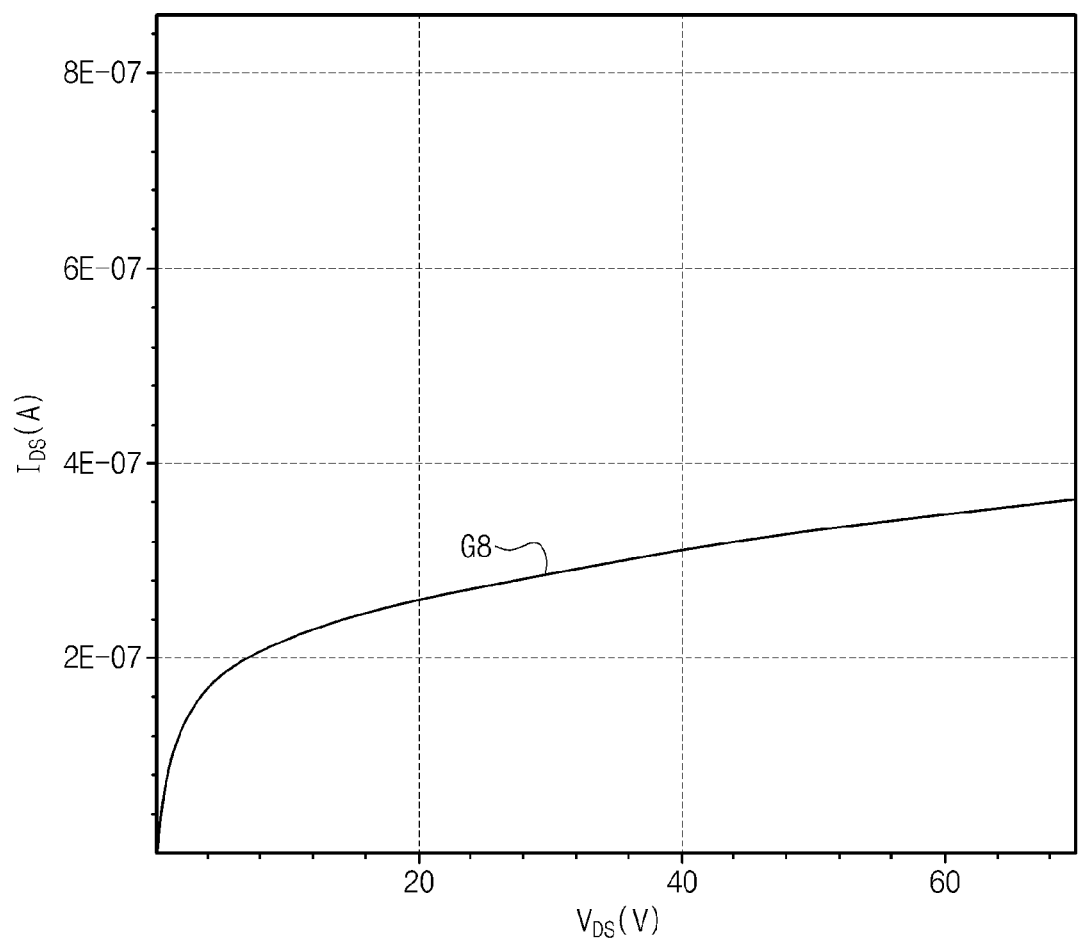
FIG. 9A and FIG. 9B are graphs showing a relationship between a kink current and a drain-source voltage of a thin film transistor to explain a band-to-band tunneling phenomenon.
Figure 9B:
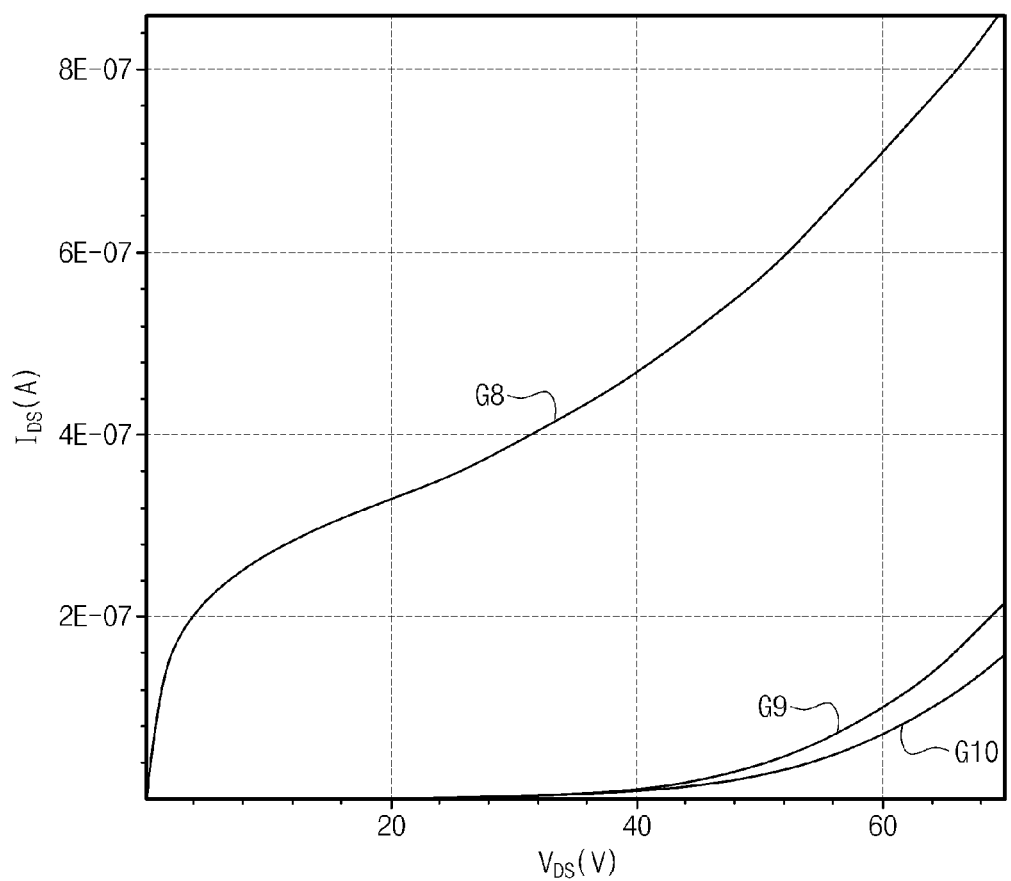

FIGS. 9A and 9B are graphs showing a relationship between the kink current Ids and a drain-source voltage Vds of a thin film transistor to explain a band-to-band tunneling phenomenon. FIG. 9A is a simulation graph of the kink current Ids of the thin film transistor in which no band-to-band tunneling phenomenon occurs, and FIG. 9B is a simulation graph of the kink current Ids of the thin film transistor in which the band-to-band tunneling phenomenon occurs. An eighth curve G8, a ninth curve G9, and a tenth curve G10 shown in FIGS. 9A and 9B have the gate-source voltage of about 4 volts, zero (0) volts, and about −4 volts, respectively.

As shown in FIG. 9A, the kink current Ids of the thin film transistor in which no ban-to-band tunneling occurs is very low. When the gate-source voltage Vgs is equal to or less than zero (0) volts, the kink current Ids does not occur in the turned-off thin film transistor.

Referring to FIG. 9B, the kink current Ids of the thin film transistor in which the band-to-band tunneling occurs is greater than the kink current Ids shown in FIG. 9A. The kink current Ids occurs in the turned-off thin film transistor when the gate-source voltage Vgs is equal to or less than zero (0) volts. As shown in FIG. 9B, the kink current Ids starts occurring at a value of drain-source voltage Vds equal to or greater than zero (0) volts.

As shown in FIGS. 8A, 8B, 9A, and 9B, the reason why the kink current Ids occurs in the transistors NT3, NT4, NT15, and NT16 connected to the first node NQ is because of the band-to-band tunneling phenomenon. In the present exemplary embodiment, the band-to-band tunneling phenomenon of the transistors NT3, NT4, NT15, and NT16 connected to the first node NQ is controlled by the control electrode applied with the reference voltage (or the bias voltage).

Figure 10:
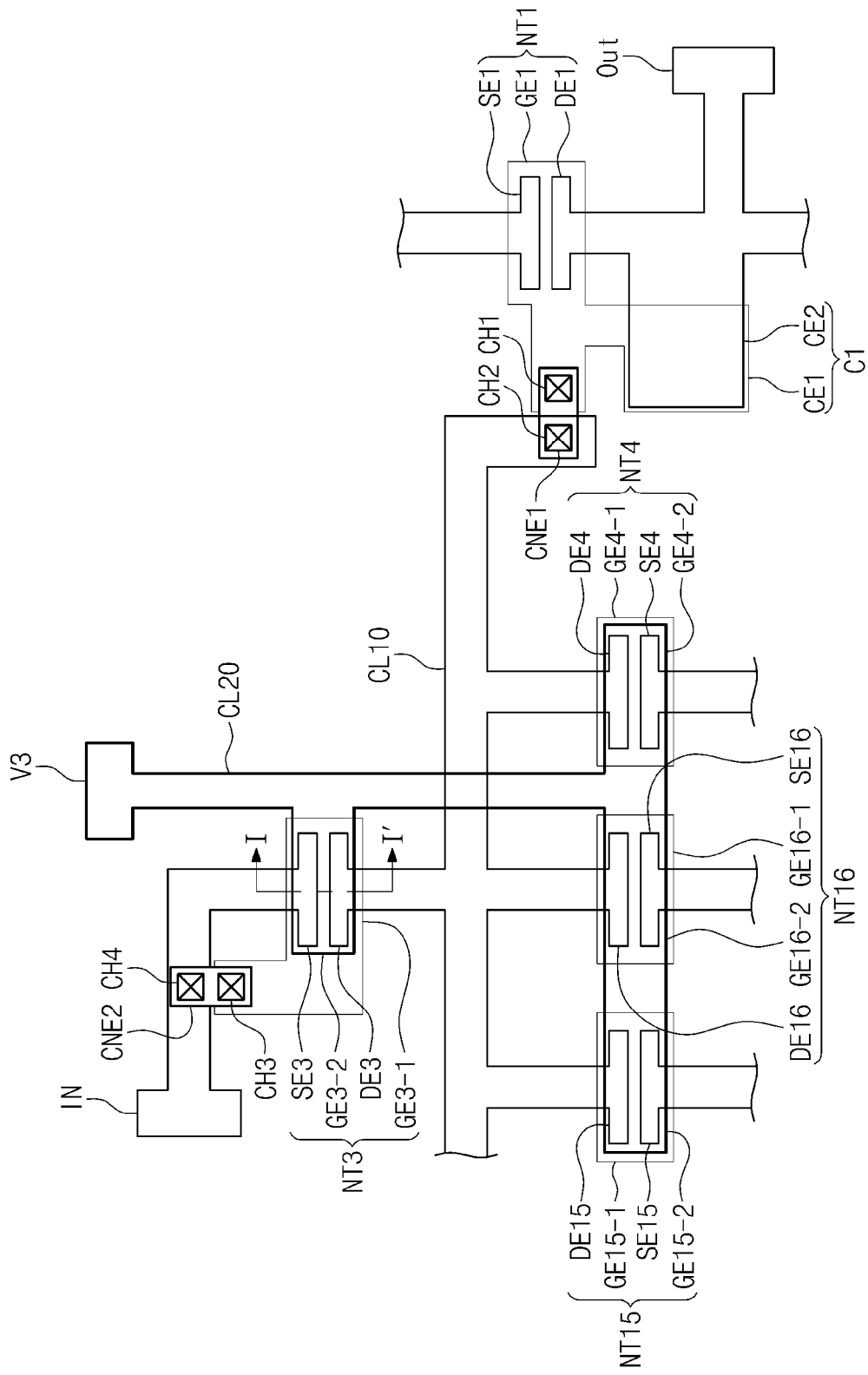
FIG. 10 is a plan view showing a layout of a portion of the i-th stage shown in FIG. 5.
Figure 11:
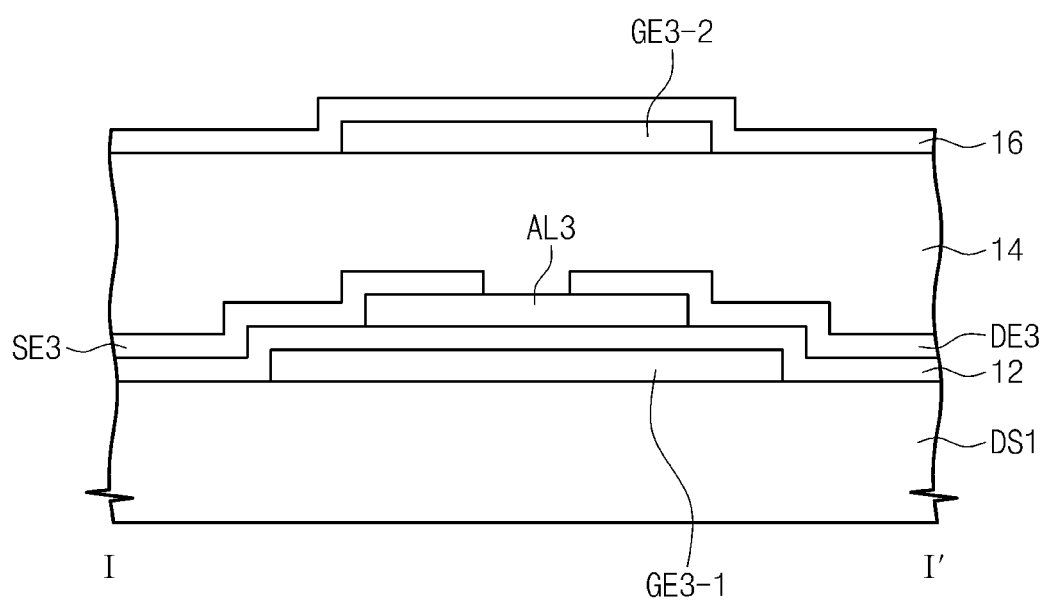
FIG. 11 is a cross-sectional view taken along a line I-I' of FIG. 10.

FIG. 10 is a plan view showing a layout of a portion of the i-th stage shown in FIG. 5, and FIG. 11 is a cross-sectional view taken along a line I-I' of FIG. 10.

Referring to FIGS. 10 and 11, the i-th stage includes first conductive patterns, second conductive patterns, and third conductive patterns, which are disposed on different layers from each other. The first conductive patterns form the first control electrodes of the transistors NT3, NT4, NT15, and NT16. The second conductive patterns form the input electrodes and the output electrodes of the transistors NT3, NT4, NT15, and NT16.

The first conductive patterns are disposed on the same layer as the gate electrode GE of the transistor TR included in the pixel PXij (refer to FIG. 3). The first conductive patterns are formed of the same material as the gate electrode GE of the transistor TR included in the pixel PXij (refer to FIG. 3) using the same process.

The second conductive patterns are disposed on the same layer as the source electrode SE or the drain electrode DE of the transistor TR included in the pixel PXij (refer to FIG. 3). The second conductive patterns are formed of the same material as the source electrode SE or the drain electrode DE of the transistor TR included in the pixel PXij (refer to FIG. 3) using the same process.

The third conductive patterns are disposed on the same layer as the pixel electrode PE included in the pixel PXij (refer to FIG. 3). The third conductive patterns are formed of the same material as the pixel electrode PE included in the pixel PXij (refer to FIG. 3) using the same process.

A portion of the second conductive patterns forms a first line CL10 used to connect the transistors NT3, NT4, NT15, and NT16 to each other. In addition, a portion of the third conductive patterns forms a second line CL20. The active layers of the transistors NT3, NT4, NT15, and NT16 are not shown in FIG. 10.

The first line CL10 shown in FIG. 10 corresponds to the first node NQ shown in FIG. 5. The second line CL20 connects the third voltage input terminal V3 to second control electrodes GE3-2, GE4-2, GE15-2, and GE16-2 of the transistors NT3, NT4, NT15, and NT16 shown in FIG. 5.

The control electrode GE1 of the first output transistor NT1 is connected to the first line CL10. The control electrode GE1 of the first output transistor NT1 and the first line CL10 are connected to each other through a first contact hole CH1 and a second contact hole CH2. A first connection electrode CNE1 disposed in the first and second contact holes CH1 and CH2 to connect the control electrode GE1 of the first output transistor NT1 and the first line CL10 corresponds to the portion of the third conductive patterns.

The input electrode SE1 and the output electrode DE1 of the first output transistor NT1 are overlapped with the control electrode GE1. The input electrode SE1 and the output electrode DE1 of the first output transistor NT1 are disposed on the same layer and spaced apart from each other. The output electrode DE1 of the first output transistor NT1 is connected to the output terminal OUT of the i-th stage.

A first electrode CE1 of the first capacitor C1 is connected to the first control electrode GE1 of the first output transistor NT1. A second electrode CE2 of the first capacitor C1 is disposed to face the first electrode CE1 while interposing the insulating layer therebetween. The second electrode CE2 of the first capacitor C1 is connected to the output electrode DE1 of the first output transistor NT1.

The first control electrode GE3-1 of the first control transistor NT3 is connected to the input terminal IN of the i-th stage. The first control electrode GE3-1 of the first control transistor NT3 and the input terminal IN of the i-th stage are connected to each other through a third contact hole CH3 and a fourth contact hole CH4. A second connection electrode CNE2 disposed in the third and fourth contact holes CH3 and CH4 to connect the first control electrode GE3-1 of the first control transistor NT3 and the input terminal IN of the i-th stage corresponds to the portion of the third conductive patterns.

The input electrode SE3 of the first control transistor NT3 is connected to the input terminal IN of the i-th stage. The output electrode DE3 of the first control transistor NT3 is disposed on the same layer as the input electrode SE3 and spaced apart from the input electrode SE3. The output electrode DE3 of the first control transistor NT3 is connected to the first line CL10. The second control electrode GE3-2 of the first control transistor NT3 is connected to the second line CL20.

The first control electrode GE4-1 of the second control transistor NT4 is connected to the first control terminal CT1 (refer to FIG. 5) of the (i)th stage. The output electrode DE4 of the second control transistor NT4 is connected to the first line CL10. The input electrode SE4 of the second control transistor NT4 is disposed on the same layer as the output electrode DE4 and spaced apart from the output electrode DE4. The second control electrode GE4-2 of the second control transistor NT4 is connected to the second line CL20.

The first control electrode GE15-1 of the first stabilization transistor NT15 is connected to the second control terminal CT2 (refer to FIG. 5) of the i-th stage, and the first control electrode GE16-1 of the second stabilization transistor NT16 is connected to the second node NA (refer to FIG. 5). The output electrodes DE15 and DE16 of the first and second stabilization transistors NT15 and NT16 are connected to the first node NQ (refer to FIG. 5). The input electrodes SE15 and SE16 of the first and second stabilization transistors NT15 and NT16 are disposed on the output electrodes DE15 and DE16 and spaced apart from the output electrodes DE15 and DE16, respectively. The second control electrodes GE15-2 and GE16-2 of the first and second stabilization transistors NT15 and NT16 are connected to the second line CL20.

FIG. 11 shows across-section of only the first control transistor NT3 among the transistors NT3, NT4, NT15, and NT16, but other transistors NT4, NT15, and NT16 have the same structure as shown in FIG. 11.

The first control electrode GE3-1 of the first control transistor NT3 is disposed on the first substrate DS1. The first insulating layer 12 covers the first control electrode GE3-1.

The active layer AL3 is disposed on the first insulating layer 12 to overlap with the first control electrode GE3-1. The active layer AL3 includes the semiconductor layer and the ohmic contact layer (not shown). The input electrode SE3 and the output electrode DE3 of the first control transistor NT3 are disposed on the first insulating layer 12. Each of the input electrode SE3 and the output electrode DE3 is partially overlapped with the active layer AL3.

The second insulating layer 14 is disposed on the first insulating layer 12 to cover the active layer AL3, the input electrode SE3, and the output electrode DE3. The second control electrode GE3-2 of the first control transistor NT3 is disposed on the second insulating layer 14. The third insulating layer 16 is disposed on the second insulating layer 14 to cover the second control electrode GE3-2.

The kink current occurs in the output electrode DE3 while a high output-input voltage, i.e., the drain-source voltage, is applied. The band-to-band tunneling phenomenon occurs in an area in which the output electrode DE3 makes contact with the active layer AL3 due to a rapid variation of the band. A hole current increased by the band-to-band tunneling phenomenon causes the kink current.

The first control transistor NT3 including the first control electrode GE3-1 and the second control electrode GE3-2 decreases the kink current. A positive (+) bias voltage applied to the second control electrode GE3-2 restricts movement of the holes in the area of the output electrode DE3 among hole-electron pairs generated by the band-to-band tunneling phenomenon. When the positive (+) bias voltage is applied to the second control electrode GE3-2, electrons are gathered in the area of the output electrode DE3 and the holes are located at a center of a channel when compared to the electrons. The holes located at the center of the channel disturb the flow of the kink current.

As described above, when the kink current is decreased in the transistors NT3, NT4, NT15, and NT16 connected to the first node NQ, the first output transistor NT1 may be prevented from being turned on late. Thus, the gate signals output from the stages may be prevented from being delayed.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A gate driving circuit comprising:
    a plurality of stages, each of the plurality of stages configured to output a gate signal, connected to each other one after another, an i-th stage (i is an integer number equal to or greater than 2) among the stages comprising:
        an output transistor comprising a control electrode connected to a first node, the first node having an electric potential increased by a control signal from a previous stage of the i-th stage, and the output transistor configured to receive a clock signal to output a gate signal of the i-th stage; and
        a control part comprising at least one control transistor comprising an output electrode connected to the first node, the control part configured to control turn on and off of the output transistor,
    wherein the at least one control transistor comprises a first control electrode and a second control electrode disposed on a layer different from a layer on which the first control electrode is disposed, and
    wherein the first control electrode is configured to receive a switching control signal and the second control electrode is configured to receive a reference voltage having a constant positive voltage level.

2. The gate driving circuit of claim 1, wherein the reference voltage is greater than zero (0) volts and equal to or less than 15 volts.

3. The gate driving circuit of claim 1, wherein the at least one control transistor comprises:
    an active layer disposed on the first control electrode, overlapped with the first control electrode, and insulated from the first control electrode;
    an input electrode disposed on the active layer and overlapped with the active layer; and
    an output electrode disposed on the active layer, overlapped with the active layer, and spaced apart from the input electrode, and the input electrode and the output electrode are disposed under and insulated from the second control electrode.

4. The gate driving circuit of claim 1, wherein each of the plurality of stages is configured to apply the gate signal to a display panel comprising a plurality of pixels, at least one of the pixels comprising:
    a thin film transistor configured to output a data signal in response to the gate signal;
    a liquid crystal capacitor comprising a first electrode connected to the thin film transistor and a second electrode facing the first electrode, a liquid crystal layer being disposed therebetween; and
    a storage capacitor connected in parallel with the liquid crystal capacitor, the first electrode configured to receive a voltage corresponding to the data signal, the second electrode configured to receive a voltage having a level different from a level of the voltage applied to the first electrode, and the reference voltage having a same level as the voltage applied to the second electrode.

5. The gate driving circuit of claim 1, wherein the previous stage is an (i−1)th stage.

6. The gate driving circuit of claim 5, wherein the at least one control transistor comprises a first control transistor configured to increase the electric potential of the first node to turn on the output transistor, and the switching control signal from the first control transistor comprises a carry signal from the (i−1)th stage.

7. The gate driving circuit of claim 6, wherein the first control transistor comprises the first control electrode and an input electrode, both of which being configured to receive the carry signal, an output electrode connected to the first node, and the second control electrode, which is configured to receive the reference voltage.

8. The gate driving circuit of claim 6, wherein the at least one control transistor further comprises a second control transistor configured to decrease the electric potential of the first node to turn off the output transistor, and the switching control signal of the second control transistor comprises a gate signal of a next stage of the i-th stage.

9. The gate driving circuit of claim 8, wherein the next stage of the i-th stage is an (i+1) stage, and the second control transistor comprises a first control electrode configured to receive the gate signal from the (i+1)th stage, an input electrode configured to receive a low voltage to decrease the electric potential of the first node, an output electrode connected to the first node, and a second control electrode configured to receive the reference voltage.

10. The gate driving circuit of claim 9, wherein the i-th stage comprises a stabilization part configured to stabilize the first node to the low voltage, the stabilization part comprising:
a first stabilization transistor configured to apply the low voltage to the first node in response to the gate signal from an (i+2)th stage; and
a second stabilization transistor configured to hold the electric potential of the first node at the low voltage during a turn-off period of the output transistor.

11. The gate driving circuit of claim 10, wherein the first stabilization transistor comprises a first control electrode configured to receive the gate signal from the (i+2)th stage, an input electrode configured to receive the low voltage, an output electrode connected to the first node, and a second control electrode configured to receive the reference voltage, and the second stabilization transistor comprises a first control electrode connected to the second node, an input electrode configured to receive the low voltage, an output electrode connected to the first node, and a second control electrode configured to receive the reference voltage.

12. A display apparatus comprising:
a display panel comprising a plurality of gate lines, a plurality of data lines insulated from the gate lines while crossing the gate lines, and a plurality of pixels each connected to a corresponding gate line of the gate lines and a corresponding data line of the data lines;
a data driving circuit configured to apply data signals to the data lines; and
a gate driving circuit comprising a plurality of stages connected to each other one after another, the gate driving circuit configured to apply gate signals to the gate lines, an i-th stage (i is an integer number equal to or greater than 2) among the stages comprising:
an output transistor comprising a control electrode connected to a first node, the first node having an electric potential increased by a control signal from a previous stage of the i-th stage, and the output transistor configured to receive a clock signal to output a gate signal of the i-th stage; and
a control part comprising at least one control transistor comprising an output electrode connected to the first node, the control part configured to control turn on and off of the output transistor,
wherein the control transistor comprises a first control electrode and a second control electrode disposed on a layer different from a layer on which the first control electrode is disposed, and
wherein the first control electrode is configured to receive a switching control signal and the second control electrode is configured to receive a reference voltage having a constant positive voltage level.

13. The display apparatus of claim 12, wherein the control transistor comprises:
a first active layer disposed on the first control electrode, overlapped with the first control electrode, and insulated from the first control electrode;
an input electrode disposed on the first active layer and overlapped with the first active layer; and
an output electrode disposed on the first active layer, overlapped with the first active layer, and spaced apart from the input electrode, and the input electrode and the output electrode are disposed under and insulated from the second control electrode.

14. The display apparatus of claim 13, wherein the at least one of the pixels comprises:
a thin film transistor comprising a gate electrode branched from the corresponding gate line, a second active layer overlapped with and insulated from the gate electrode, a source electrode disposed on and overlapped with the second active layer, and a drain electrode disposed on and overlapped with the second active layer and spaced apart from the source electrode;
a liquid crystal capacitor comprising a first electrode electrically connected to the drain electrode and a second electrode facing the first electrode, a liquid crystal layer being disposed between the first electrode and the second electrode; and
a storage capacitor connected in parallel with the liquid crystal capacitor,
wherein the first active layer and the second active layer are disposed on the same layer, and the first electrode and the second control electrode are disposed on the same layer.

15. The display apparatus of claim 14, wherein the first electrode is configured to receive a pixel voltage, the second electrode is configured to receive a common voltage having a level different from the pixel voltage, and the reference voltage has a same level as the common voltage.

16. The display apparatus of claim 14, wherein the storage capacitor comprises a first electrode and a storage line facing the first electrode, an insulating layer is disposed therebetween, the storage line is configured to receive a storage voltage having a level different from the pixel voltage, and the reference voltage has a same level as the storage voltage.

17. The display apparatus of claim 12, wherein the previous stage is an (i−1)th stage.

18. The display apparatus of claim 17, wherein the control transistor comprises a first control transistor configured to increase the electric potential of the first node to turn on the output transistor, and the switching control signal from the first control transistor is a carry signal from the (i−1)th stage.

19. The display apparatus of claim 18, wherein the first control transistor comprises the first control electrode and an input electrode, both of which being configured to receive the carry signal, an output electrode connected to the first node, and the second control electrode configured to receive the reference voltage.

20. The display apparatus of claim 19, wherein the control transistor further comprises a second control transistor configured to decrease the electric potential of the first node to turn off the output transistor, and the switching control signal of the second control transistor is a gate signal of a next stage of the i-th stage.

21. The display apparatus of claim 20, wherein the next stage of the i-th stage is an (i+1) stage, and the second control transistor comprises a first control electrode configured to receive the gate signal from the (i+1)th stage, an input electrode configured to receive a low voltage to decrease the electric potential of the first node, an output electrode connected to the first node, and a second control electrode configured to receive the reference voltage.

22. The display apparatus of claim 21, wherein the i-th stage further comprises a stabilization part configured to stabilize the first node to the low voltage, and the stabilization part comprises:
a first stabilization transistor configured to apply the low voltage to the first node in response to the gate signal from an (i+2)th stage; and
a second stabilization transistor configured to hold the electric potential of the first node at the low voltage during a turn-off period of the output transistor.

23. The display apparatus of claim 22, wherein the first stabilization transistor comprises a first control electrode to receive the gate signal from the (i+2)th stage, an input electrode configured to receive the low voltage, an output electrode connected to the first node, and a second control electrode configured to receive the reference voltage, and the second stabilization transistor comprises a first control electrode connected to the second node, an input electrode configured to receive the low voltage, an output electrode connected to the first node, and a second control electrode configured to receive the reference voltage.

24. The display apparatus of claim 12, wherein the output transistor comprises an input electrode configured to receive the clock signal and an output electrode configured to output the i-th gate signal.

25. A method for driving a gate line of a display panel, comprising:
applying a clock signal to an input electrode of a first transistor, and outputting the clock signal from an output electrode of the first transistor as a gate signal to the gate line;
increasing an electric potential of a node connected to a control electrode of the first transistor by applying a control signal to a first control electrode of a second transistor, the second transistor comprising an output electrode connected to the node; and
increasing a rate at which the electric potential of the node increases by decreasing a kink current flowing in the second transistor,
wherein the decreasing the kink current flowing in the second transistor comprises applying a constant positive voltage to a second control electrode of the second transistor, wherein the second control electrode of the second transistor is disposed to overlap with the output electrode of the second transistor.

* * * * *